United States Patent
Mu et al.

(10) Patent No.: US 11,061,293 B2
(45) Date of Patent: Jul. 13, 2021

(54) GROUND STRUCTURE AND MOBILE TERMINAL

(71) Applicant: VIVO MOBILE COMMUNICATION CO., LTD., Chang'an Dongguan (CN)

(72) Inventors: Qing Mu, Chang'an Dongguan (CN); Yong Huang, Chang'an Dongguan (CN); Huayong Dai, Chang'an Dongguan (CN)

(73) Assignee: VIVO MOBILE COMMUNICATION CO., LTD., Chang'an Dongguan (CN)

(*) Notice: Subject to any disclaimer, the term of this patent is extended or adjusted under 35 U.S.C. 154(b) by 0 days.

(21) Appl. No.: 16/616,355

(22) PCT Filed: May 9, 2018

(86) PCT No.: PCT/CN2018/086119
§ 371 (c)(1),
(2) Date: Nov. 22, 2019

(87) PCT Pub. No.: WO2018/214729
PCT Pub. Date: Nov. 29, 2018

(65) Prior Publication Data
US 2020/0159076 A1    May 21, 2020

(30) Foreign Application Priority Data

May 23, 2017   (CN) .......................... 201710369658.3

(51) Int. Cl.
*H05K 9/00*     (2006.01)
*G02F 1/1362*   (2006.01)
(Continued)

(52) U.S. Cl.
CPC ........ *G02F 1/136204* (2013.01); *G06F 3/044* (2013.01); *G06F 3/0412* (2013.01); *H04M 1/0277* (2013.01); *H05K 1/147* (2013.01)

(58) Field of Classification Search
USPC ....................................................... 361/816
See application file for complete search history.

(56) References Cited

U.S. PATENT DOCUMENTS 9,200,970 B2 * 12/2015 Kodani ..................... G01L 1/16
2011/0279409 A1 * 11/2011 Salaverry .............. G06F 3/0416
345/174
(Continued)

FOREIGN PATENT DOCUMENTS

CN   101893775 A   11/2010
CN   201946973 U    8/2011
(Continued)

OTHER PUBLICATIONS

Chinese Office Action Application No. 201710369658.3; reported on Mar. 4, 2019.

(Continued)

*Primary Examiner* — Hung S. Bui
(74) *Attorney, Agent, or Firm* — von Briesen & Roper, s.c.

(57) ABSTRACT

The embodiments of the present disclosure provide a ground structure and a mobile terminal. The ground structure includes: a touchscreen ground wire, a voltage clamper, and a metal middle frame, wherein a first terminal of the voltage clamper is electrically connected to the touchscreen ground wire, a second terminal of the voltage clamper is electrically connected to the metal middle frame, and the touchscreen ground wire is arranged on a frame of a touchscreen of the mobile terminal, so as to discharge static electricity entering from a side of the touchscreen.

9 Claims, 3 Drawing Sheets

(51) Int. Cl.
  *G06F 3/041*  (2006.01)
  *G06F 3/044*  (2006.01)
  *H04M 1/02*  (2006.01)
  *H05K 1/14*  (2006.01)

(56) References Cited

U.S. PATENT DOCUMENTS

2015/0355749 A1   12/2015  Min
2017/0048366 A1*  2/2017  Jeong ................. H04M 1/0277
2020/0057521 A1*  2/2020  Lee ................... G02F 1/133512

FOREIGN PATENT DOCUMENTS

| CN | 103294251 A | 9/2013 |
| CN | 103324341 A | 9/2013 |
| CN | 103365452 A | 10/2013 |
| CN | 104357851 A | 2/2015 |
| CN | 104407738 A | 3/2015 |
| CN | 204189076 U | 3/2015 |
| CN | 106210199 A | 12/2016 |
| CN | 107205064 A | 9/2017 |

OTHER PUBLICATIONS

Chinese Search Report related to Application No. 201710369658.3 reported on May 22, 2018.
European Search Report Application No. 18805739.2; reported on Mar. 6, 2020.
International Search Report & Written Opinion related to Application No. PCT/CN2018/086119; reported on Jul. 23, 2018.

* cited by examiner

GROUND STRUCTURE AND MOBILE TERMINAL

CROSS-REFERENCE TO RELATED APPLICATION

The present application is the U.S. national phase of PCT Application No. PCT/CN2018/086119 filed on May 9, 2018, which claims the priority of the Chinese patent application 201710369658.3 filed on May 23, 2017, which are incorporated herein by reference in their entirety.

TECHNICAL FIELD

The present disclosure relates to communication technologies, and in particular relates to a ground structure and a mobile terminal.

BACKGROUND

With fast and continuous development of an electronic technology, a design of a touchscreen with a narrow frame and without a frame is becoming more and more popular. When the frame of the touchscreen is becoming increasingly narrower, an electrostatic problem of a mobile terminal is becoming more and more obvious. When a side step of a metal middle frame of the mobile terminal is made of plastic, static electricity entering from the side of the touchscreen may be discharged directly to a liquid crystal module easily. The narrower the touchscreen frame is, the shorter a distance from a touchscreen edge to the liquid crystal module is, then the shorter a path from the static electricity to the liquid crystal module is, that is, the easier it is to discharge the static electricity directly to the liquid crystal module, thereby causing a damage to the mobile terminal.

SUMMARY

The embodiments of the present disclosure provide a ground structure and a mobile terminal to solve a problem of destroying the mobile terminal by directly discharging static electricity entering from a side of the touchscreen to a liquid crystal module.

In a first aspect, the embodiments of the present disclosure provide a ground structure, including:

a touchscreen ground wire, a voltage clamper, and a metal middle frame, wherein a first terminal of the voltage clamper is electrically connected to the touchscreen ground wire, a second terminal of the voltage clamper is electrically connected to the metal middle frame, and the touchscreen ground wire is arranged on a frame of a touchscreen of the mobile terminal, so as to discharge static electricity entering from a side of a touchscreen.

In a second aspect, the embodiments of the present disclosure provide a mobile terminal, including: the touchscreen and the ground structure described above, wherein the touchscreen is fixedly connected to the touchscreen ground wire of the ground structure.

In the embodiments of the present, the ground structure includes the touchscreen ground wire, the voltage clamper, and the metal middle frame, wherein the first terminal of the voltage clamper is electrically connected to the touchscreen ground wire, the second terminal of the voltage clamper is electrically connected to the metal middle frame, and the touchscreen ground wire is arranged on the frame of the touchscreen of the mobile terminal, so as to discharge static electricity entering from the side of the touchscreen. Thus, when the static electricity enters the mobile terminal from the side of the touchscreen, the static electricity may be discharged to the touchscreen ground wire, the voltage clamper is in the on-state, and the ground structure is in the on-state and may discharge the static electricity to realize electrostatic protection of the mobile terminal. Furthermore, when no static electricity enters the mobile terminal from the side of the touchscreen, the voltage clamper is in the off-state, and the ground structure is in the off-state, then the present disclosure effectively avoids a problem in which the touchscreen ground wire and the metal middle frame contact electrolyte simultaneously to generate a galvanic effect which causes a layer separation of the touchscreen ground wire and the touchscreen.

BRIEF DESCRIPTION OF THE DRAWINGS

In order to more clearly illustrate the technical solution of the embodiments of the present disclosure, a brief introduction of the accompanying drawings to be used in a description of the embodiments of the present disclosure will be given below. Obviously, the accompanying drawings described below are only some of the embodiments of the present disclosure, and for those ordinary skilled in the art, without creative work, other drawings may also be obtained from these drawings.

DETAILED DESCRIPTION

The technical solutions in the embodiments of the present disclosure will be described hereinafter clearly and completely with reference to the accompanying drawings of the embodiments of the present disclosure. Obviously, the embodiments described above are part of the embodiments of the present disclosure, not all of them. Based on the embodiments of the present disclosure, all other embodiments acquired by those ordinary skilled in the art without creative work will fall into the protection scope of the present disclosure.

Figure 1:
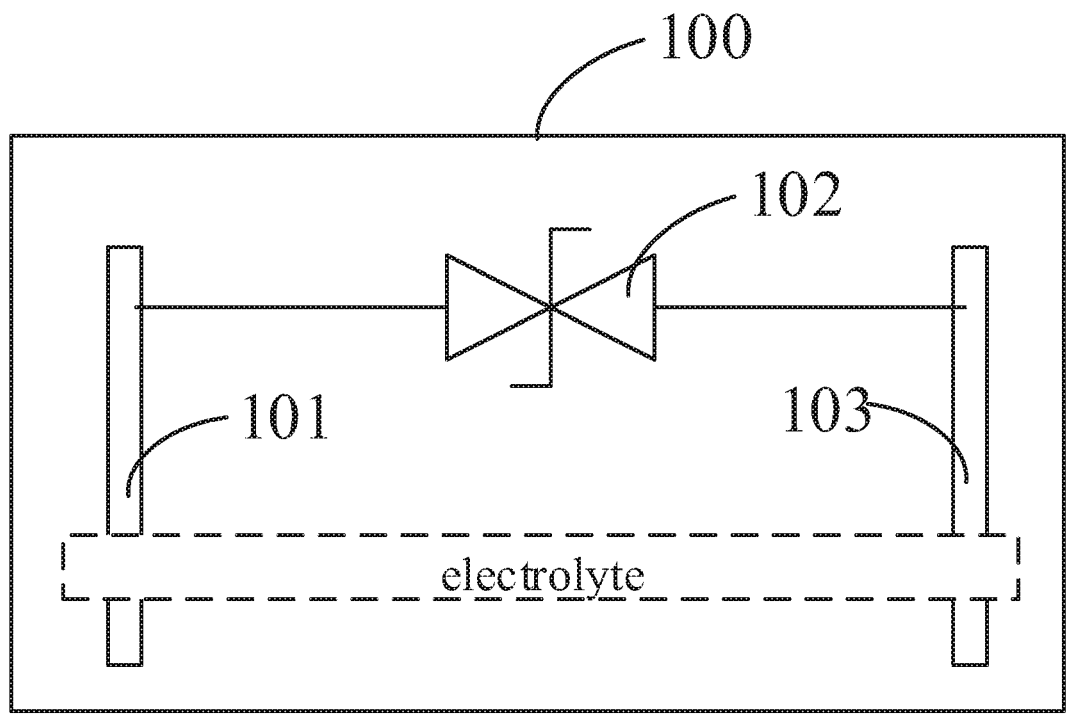
FIG. 1 is a schematic diagram illustrating a structure of a ground structure according to embodiments of the present disclosure.

Referring to FIG. 1, FIG. 1 is a schematic diagram illustrating a structure of another ground structure according to embodiments of the present disclosure. The ground structure is applied to a mobile terminal. As shown in FIG. 1, a ground structure 100 includes a touchscreen ground wire 101, a voltage clamper 102, and a metal middle frame 103.

A first terminal of the voltage clamper 102 is electrically connected to the touchscreen ground wire 101, a second terminal of the voltage clamper 102 is electrically connected to the metal middle frame 103, and the touchscreen ground wire 101 is arranged on a frame of a touchscreen of the mobile terminal, so as to discharge static electricity entering from a side of a touchscreen.

In the embodiment, the ground structure 100 is to discharge the static electricity entering from the side of the touchscreen. A first terminal of the touchscreen ground wire 101 is aligned with one end of the touchscreen, and a second terminal of the touchscreen ground wire 101 keeps a certain distance from a liquid crystal module of the mobile terminal, so as to save an occupied area of the touchscreen ground wire 101 in the mobile terminal, and directly discharge the static electricity entering from the side of the touchscreen. Then the static electricity may be prevented from discharging to the liquid crystal module, so as to realize an electrostatic protection of the mobile terminal. Optionally, in other embodiments, the first terminal of the touchscreen ground wire 101 is not be aligned with one end of the touchscreen, and the second terminal is not limited to keeping a certain distance from the liquid crystal module of the mobile terminal. The touchscreen ground wire may be, but is not limited to, a silver paste wire or a copper wire, which may be determined according to actual needs specifically.

The voltage clamper 102 is an efficient circuit protection device, which has characteristics of a low clamping voltage, a fast response time and a strong surge absorption capacity. When a voltage across two terminals of the voltage clamper 102 is larger than a breakdown voltage, the voltage clamper 102 is in an on-state, and when the voltage across two terminals of the voltage clamper 102 is smaller or equal to a breakdown voltage, it is in a cut-off state. It should be noted that a reference sign of the voltage clamper 102 in FIG. 1 is only an example, and thereby does not limit a type of the voltage clamper 102.

The metal middle frame 103 may be, but is not limited to, made of magnesium alloy, aluminum alloy or other conductive materials. In addition, a side step of the metal middle frame 103 may be made of a non-conductive material, such as plastic.

When the static electricity is discharged to the ground structure 100, the voltage across two terminals of the voltage clamper 102 is much larger than the breakdown voltage since the static electricity voltage is as high as 10,000V Then the voltage clamper 102 is in the on-state, and the touchscreen ground wire 101 and the metal middle frame 103 constitute a closed loop, then the discharge of the static electricity is completed to realize an electrostatic protection of the mobile terminal.

When no electrostatic enters the grounding structure 100, the voltage across two terminals of the voltage clamper 102 is zero, and is smaller than the breakdown voltage. Then the voltage clamper 102 is in the cut-off state, and the ground structure is in the cut-off state and does not form a closed loop. Therefore, even though the touchscreen ground wire 101 and the metal middle frame 103 are different in activity and contact electrolyte simultaneously, the touchscreen ground wire 101 and the metal middle frame 103 do not form a closed loop, which does not meet a basic condition of a galvanic effect, thus effectively avoiding that the touchscreen ground wire 101 and the metal mid-frame 103 generate the galvanic effect. Furthermore, electrons migrate continuously from the metal middle frame 103 which is more active to the touchscreen ground wire 101 through the closed loop since the touchscreen ground wire 101 and the metal mid-frame 103 generate the galvanic effect, then a mass of the touchscreen ground wire 101 is increased and an adhesion of the touchscreen ground wire 101 is decreased, which ultimately results in a layer separation of the touchscreen ground wire 101 and the touchscreen. Herein the electrolyte may be sweat or drinks entering from the side of the touchscreen.

In the embodiments of the present disclosure, the mobile terminal may be, such as a mobile phone, a tablet personal computer, a laptop computer, a personal digital assistant (FDA), a mobile internet device (MID), a wearable device, etc.

The ground structure of the embodiment includes the touchscreen ground wire, the voltage clamper, and the metal middle frame, wherein the first terminal of the voltage clamper is electrically connected to the touchscreen ground wire, the second terminal of the voltage clamper is electrically connected to the metal middle frame, and the touchscreen ground wire is arranged on the frame of the touchscreen of the mobile terminal, so as to discharge static electricity entering from the side of the touchscreen. Thus, when the static electricity enters the mobile terminal from the side of the touchscreen, the static electricity can be discharged to the touchscreen ground wire, the voltage clamper is in the on-state, and the ground structure is in the on-state and may discharge the static electricity to realize an electrostatic protection of the mobile terminal. Furthermore, when no static electricity enters the mobile terminal from the side of the touchscreen, the voltage clamper is in the off-state, and the ground structure is in the off-state, then the present disclosure may effectively avoid a problem in which the touchscreen ground wire and the metal middle frame contact electrolyte simultaneously to generate a galvanic effect, which results in a layer separation of the touchscreen ground wire and the touchscreen.

Figure 2:
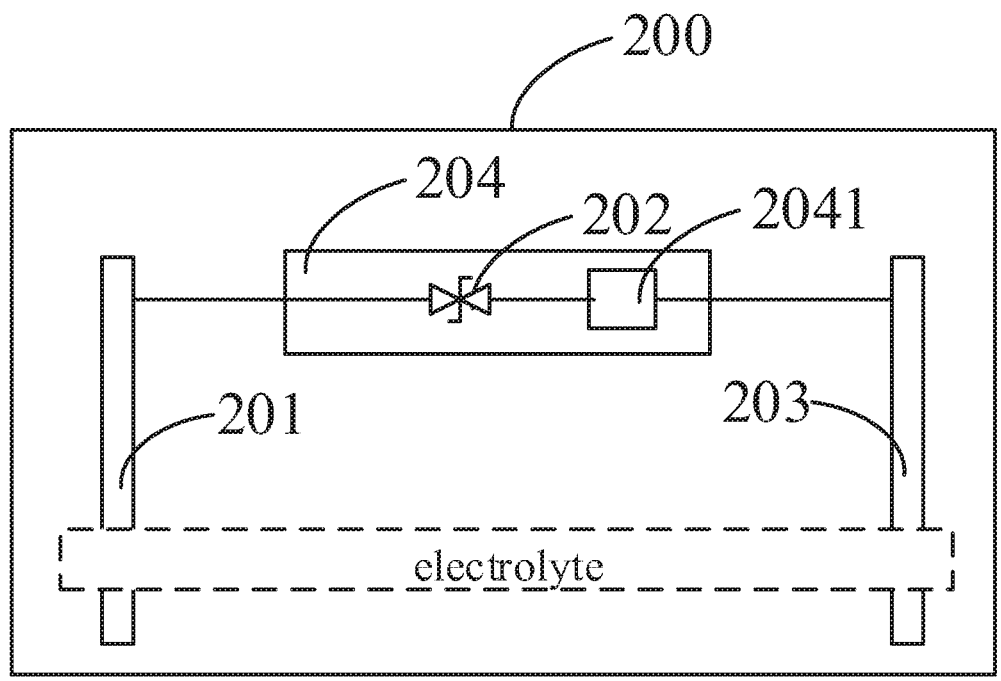
FIG. 2 is another schematic diagram illustrating a structure of another ground structure according to embodiments of the present disclosure.

Referring to FIG. 2, FIG. 2 is a schematic diagram illustrating a structure of another ground structure according to embodiments of the present disclosure. As shown in FIG. 2, a ground structure 200 includes a touchscreen ground wire 201, a voltage clamper 202, a metal middle frame 203 and a touchscreen flexible printed circuit board 204.

In the embodiment, the voltage clamper 202 is arranged on the touchscreen flexible printed circuit board 204, a first terminal of the voltage clamper 202 is electrically connected to the touchscreen ground wire 201, and a second terminal of the voltage clamper 202 is electrically connected to a first terminal of a ground bare area 2041 of the touchscreen flexible printed circuit board 204, a second terminal of the ground bare area 2041 is electrically connected to the metal middle frame 203. Furthermore, for example, the second terminal of the ground bare area 2041 is electrically connected to the metal middle frame 203 through a conductive foam. The ground bare area 2041 is a bare part of a ground area of the touchscreen flexible printed circuit board 204, such as a ground bare copper area, that is, the bare part of the ground area of the touchscreen flexible printed circuit board 204 is made of copper. However, a material of the bare part of the ground area of the touchscreen flexible printed circuit board 204 is not limited by the embodiment of the present disclosure, which may be determined according to actual needs specifically.

In the embodiment, the voltage clamper is arranged on the touchscreen flexible printed circuit board, the second terminal of the voltage clamper is electrically connected to the metal middle frame through the ground bare area of the touchscreen flexible printed circuit board, then the discharge of the static electricity is completed to realize an electrostatic protection of the mobile terminal. In addition, due to a shorter route from the touchscreen ground wire to the voltage clamper, and the voltage clamper may be electrically connected to the metal middle frame directly through the ground bare area of the touchscreen flexible printed circuit board, a path of discharging the static electricity is shorter, thus a better electrostatic protection effect is achieved.

Optionally, the voltage clamper 202 is a transient voltage suppression diode, a varistor or a polymer electrostatic impeder. Furthermore, the voltage clamper 202 is a unidirectional or bidirectional transient voltage suppression diode, a varistor or a polymer electrostatic impeder. When the voltage clamper 202 is unidirectional, a negative electrode of the voltage clamper 202 is electrically connected to the touchscreen ground wire 201, a positive electrode of the voltage clamper 202 is electrically connected to the metal middle frame 203, the voltage clamper 202 is connected reversely.

Optionally, the voltage clamper 202 may be a unidirectional transient voltage suppression diode since the transient voltage suppression diode has a faster response time and a strong electrostatic protection ability compared with other voltage clampers such as the varistor. A negative electrode of the unidirectional transient voltage suppression diode is electrically connected to the touchscreen ground wire 201, a positive electrode of the unidirectional transient voltage suppression diode is electrically connected to the metal middle frame 203, and thus a better electrostatic protection of the mobile terminal is realized.

Optionally, a material activity of the touchscreen ground wire 201 is different from that of the metal middle frame 203, i.e., the material activity of touchscreen ground wire 201 differs from that of metal frame 203. Furthermore, the touchscreen ground wire 201 is made of silver, i.e., the touchscreen ground wire 201 is a silver paste wire, and the metal middle frame 203 is made of magnesium alloy. Optionally, in other embodiments, the touchscreen ground wire 201 may be, but is not limited to, made of other conductive materials such as copper, the metal middle frame 203 may be, but is not limited to, made of other conductive materials such as aluminum alloy, which may be determined according to actual needs specifically. In addition, a side step of the metal middle frame 203 may be made of a non-conductive material, such as plastic.

Because the touchscreen is a communication channel between a user and the mobile terminal, and may need to contact a human body at any time, when the user holds the mobile terminal, the static electricity of the human body will easily enter the mobile terminal through both sides of the touchscreen. Therefore, optionally, the touchscreen ground wire 201 includes a first touchscreen ground wire and a second touchscreen ground wire, the first touchscreen ground wire and the second touchscreen ground wire are arranged on the frame of the touchscreen relative to each other, and the first terminal of the voltage clamper 202 is electrically connected to the first touchscreen ground wire and the second touchscreen ground wire respectively, the second terminal of the voltage clamper 202 is electrically connected to the metal middle frame, and thus a better electrostatic protection of the mobile terminal is realized. Optionally, in other embodiments, the touchscreen ground wires are arranged ground the touchscreen frame, and each touchscreen ground wire is electrically connected to one voltage clamper respectively, which is not limited here.

Figure 3:
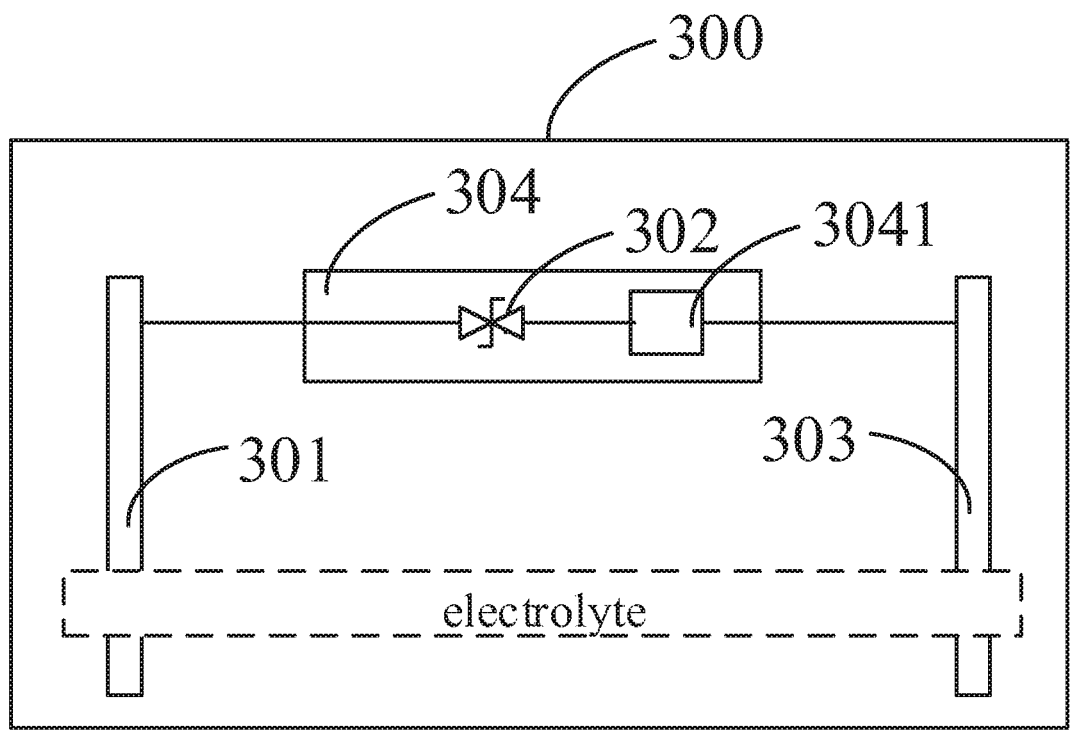
FIG. 3 is still another schematic diagram illustrating a structure of another ground structure according to embodiments of the present disclosure.

Referring to FIG. 3, FIG. 3 is a schematic diagram illustrating a structure of another ground structure according to embodiments of the present disclosure. As shown in FIG. 3, a ground structure 300 includes a touchscreen ground wire 301, a voltage clamper 302, a metal middle frame 303 and a motherboard 304.

In the embodiment, the voltage clamper 302 is arranged on the motherboard 304, wherein a first terminal of the voltage clamper 302 is electrically connected to the touchscreen ground wire 301, a second terminal of the voltage clamper 302 is electrically connected to a first terminal of a motherboard ground 3041 of the motherboard 304, and a second terminal of the motherboard ground 3041 is electrically connected to the metal middle frame 303. The motherboard ground 3041 is a ground area of the motherboard 304. Furthermore, the second terminal of the motherboard ground 3041 is electrically connected to the metal middle frame 303 through a conductive foam and a screw.

The voltage clamper is arranged on the motherboard, the second terminal of the voltage clamper is electrically connected to the metal middle frame through the motherboard ground of the motherboard, and thus the discharge of the static electricity is completed to realize an electrostatic protection of the mobile terminal. In addition, setting the voltage clamper on the motherboard does not increase other costs or process requirements, thus costs and procedures are saved.

Figure 4:
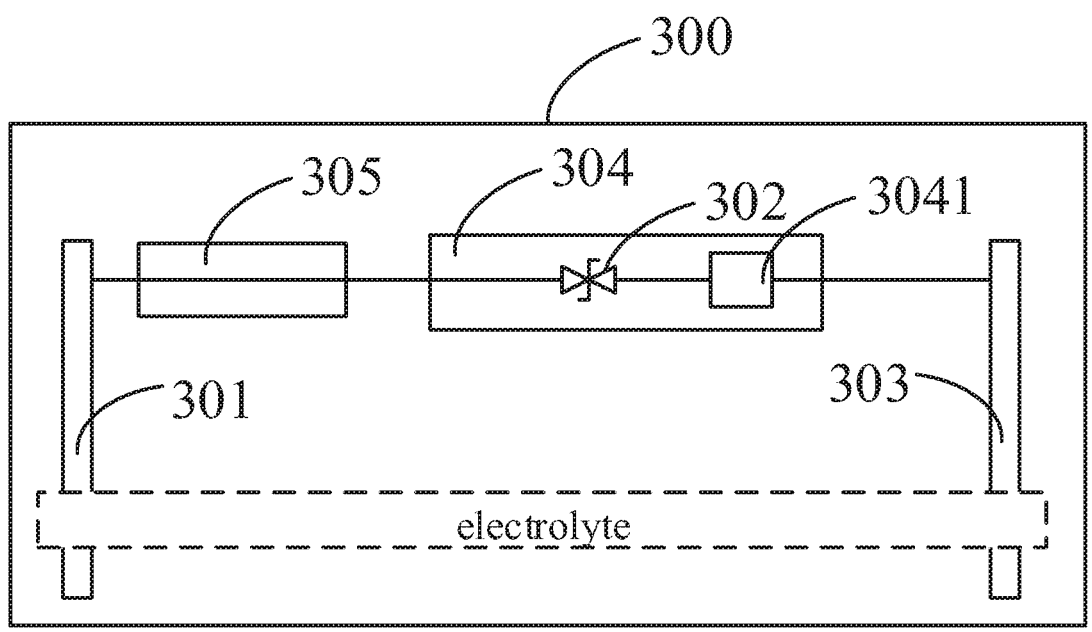
FIG. 4 is yet still another schematic diagram illustrating a structure of another ground structure according to embodiments of the present disclosure.

Referring to FIG. 4, compared with the ground structure shown in FIG. 3, a touchscreen flexible printed circuit board 305 is added in the ground structure shown in FIG. 4. The touchscreen flexible printed circuit board 305 is electrically connected to the motherboard 304 through a connector, such as a board-to-board connector, which is not limited here. The first terminal of the voltage clamper 302 is electrically connected to the touchscreen ground wire 301 through the touchscreen flexible printed circuit board 305, a connection route between the first terminal of the voltage clamper 302 and the touchscreen ground wire 301 is arranged on the touch screen flexible printed circuit board 305 to save a space occupied by the ground structure in the mobile terminal. It should be noted that the connection route between the first terminal of voltage clamper 302 and the touchscreen ground wire 301 may be isolated from a ground area of the touchscreen flexible printed circuit board 305. Optionally, in other embodiments, the first terminal of the voltage clamp 302 is also electrically connected to the touchscreen ground wire 301 through other components, which is not limited here.

It should be noted that the components in the embodiments of the present disclosure, such as voltage clamper, touchscreen ground wire, etc., use different reference signs for identification in different embodiments, but their functions are consistent in different reference signs.

Figure 5:
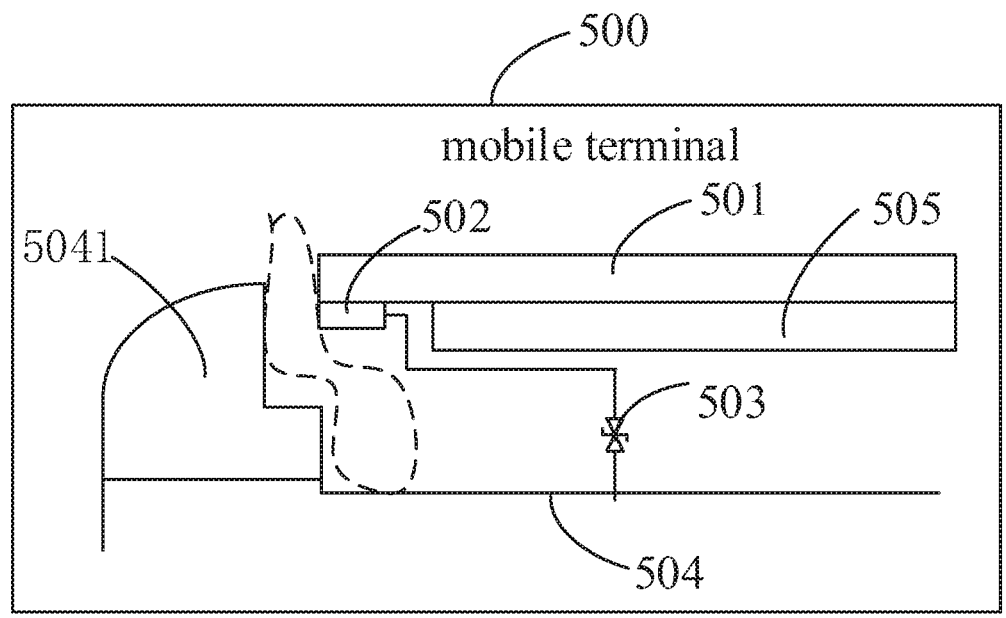
FIG. 5 is a schematic diagram illustrating a structure of a mobile terminal according to embodiments of the present disclosure.

Referring to FIG. 5, FIG. 5 is a schematic diagram illustrating a structure of a mobile terminal according to embodiments of the present disclosure. As shown in FIG. 5, a mobile terminal 500 includes a touchscreen 501, and the ground structure described above. Specifically, the ground structure may include, but is not limited to, a touchscreen ground wire 502, a voltage clamper 503 and a metal middle frame 504.

The touchscreen 501 is fixedly connected to the touchscreen ground wire 502 of the ground structure. For example, the touchscreen ground wire 502 is fixed on the touchscreen 501 by welding or an adhesive bond, which is not limited here. Further, the touchscreen ground wire 502 is arranged on a frame of the touchscreen 501. As shown in FIG. 5, a first terminal of the touchscreen ground wire 502 may be aligned with one end of the touchscreen, and a second terminal of the touchscreen ground wire 502 may keep a certain distance from a liquid crystal module 505 of the mobile terminal 500, so as to save an occupied area of the touchscreen ground wire 502 in the mobile terminal 500, and directly discharge the static electricity entering from the side of the touchscreen 501. Then the static electricity can be prevented from discharging to the liquid crystal module 505, so as to realize an electrostatic protection of the mobile terminal 500. Optionally, in other embodiments, the first terminal of the touchscreen ground wire 101 is not aligned with one end of the touchscreen, which is not limited here. In addition, a side step 5041 of the metal middle frame 504 is made of plastic, which is not limited here. A part shown with a dotted line in FIG. 5 is electrolyte.

The mobile terminal of the embodiment includes the touchscreen and the ground structure described above, the touchscreen is fixedly connected to the touchscreen ground wire of the ground structure. Thus, when the static electricity enters the mobile terminal from the side of the touchscreen, the static electricity may be discharged to the touchscreen ground wire, the voltage clamper is in the on-state, and the ground structure is in the on-state and may discharge the static electricity to realize an electrostatic protection of the mobile terminal. Furthermore, when no static electricity enters the mobile terminal from the side of the touchscreen, the voltage clamper is in the off-state, and the ground structure is in the off-state, then the present disclosure may effectively avoid a problem in which the touchscreen ground wire and the metal middle frame contact electrolyte simultaneously to generate a galvanic effect, which results in a layer separation of the touchscreen ground wire and the touchscreen.

Figure 6:
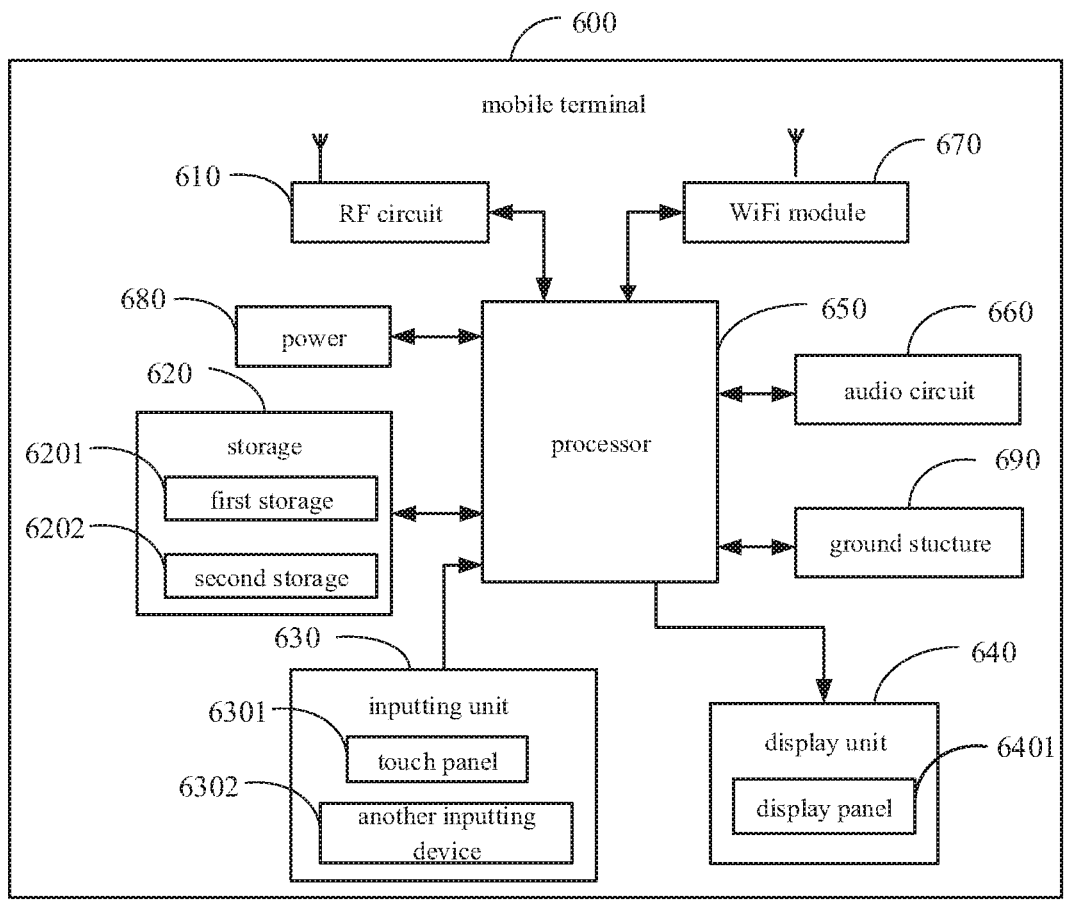
FIG. 6 is a schematic diagram illustrating a structure of another mobile terminal according to embodiments of the present disclosure.

Referring to FIG. 6, FIG. 6 is a schematic diagram of a structure of a mobile terminal according to the embodiments of the present disclosure. As shown in FIG. 6, a mobile terminal 600 includes a Radio Frequency (RF) circuit 610, a storage 620, an inputting unit 630, a display unit 640, a processor 650, an audio circuit 660, a WiFi module 670, a power 680 and a ground structure 690.

The ground structure 690 includes: a touchscreen ground wire, a voltage clamper, and a metal middle frame, wherein a first terminal of the voltage clamper is electrically connected to the touchscreen ground wire, a second terminal of the voltage clamper is electrically connected to the metal middle frame, and the touchscreen ground wire is arranged on a frame of a touchscreen of the mobile terminal, so as to discharge static electricity entering from a side of the touchscreen.

Optionally, the ground structure further includes a touchscreen flexible printed circuit board, the voltage clamper is arranged on the touchscreen flexible printed circuit board, wherein the first terminal of the voltage clamper is electrically connected to the touchscreen ground wire, and the second terminal of the voltage clamper is electrically connected to a first terminal of a ground bare area of the touchscreen flexible circuit board, a second terminal of the ground bare area is electrically connected to the metal middle frame.

Optionally, the ground structure further includes a motherboard, the voltage clamper is arranged on the motherboard, wherein the first terminal of the voltage clamper is electrically connected to the touchscreen ground wire, the second terminal of the voltage clamper is electrically connected to a first terminal of a motherboard ground of the motherboard, and a second terminal of the motherboard ground is electrically connected to the metal middle frame.

Optionally, the ground structure further includes a touchscreen flexible printed circuit board, the touchscreen flexible printed circuit board is electrically connected to the motherboard through a connector, wherein the first terminal of the voltage clamper is electrically connected to the touchscreen ground wire through the touchscreen flexible printed circuit board.

Optionally, the voltage clamper is a transient voltage suppression diode, a varistor or a polymer electrostatic impeder.

Optionally, the voltage clamper is a unidirectional transient voltage suppression diode, a negative electrode of the unidirectional transient voltage suppression diode is electrically connected to the touchscreen ground wire, and a positive electrode of the unidirectional transient voltage suppression diode is electrically connected to the metal middle frame.

Optionally, a material activity of the touchscreen ground wire is different from that of the metal middle frame.

Optionally, the touchscreen ground wire is made of silver, the metal middle frame is made of magnesium alloy.

Optionally, the second terminal of the ground bare area is electrically connected to the metal middle frame through a conductive foam.

Optionally, the second terminal of the motherboard ground is electrically connected to the metal middle frame through a conductive foam and a screw.

Optionally, the touchscreen ground wire comprises a first touchscreen ground wire and a second touchscreen ground wire, the first touchscreen ground wire and the second touchscreen ground wire are arranged on the frame of the touchscreen relatively, and the first terminal of the voltage clamper is electrically connected to the first touchscreen ground wire and the second touchscreen ground wire respectively, the second terminal of the voltage clamper is electrically connected to the metal middle frame.

Concrete implementations and beneficial effects of the grounding structure 690 may refer to the description of the grounding structure in the above-mentioned embodiments, which will not be repeated here.

The inputting unit 630 may receive inputted numeral or character information, and generate signal input related with user configuration and function control of the mobile terminal 600. Specifically, in the embodiments of the present disclosure, the inputting unit 630 may include a touch panel 6301. The touch panel 6301 is also called a touch screen, and may collect a touch operation performed by a user on or near the touch panel 6301 (e.g., the user performs an operation on or near the touch panel 6301 with any suitable object or accessory such as a finger and a touchpen), and drive a connection device according to a preset program. Optionally, the touch panel 6301 may include a touch detecting device and a touch controller. The touch detecting device may detect a touch position of the user, detect a signal generated based on the touch operation, and transmit the signal to the touch controller. The touch controller may receive touch information from the touch detecting device, convert the touch information into a touch point coordinate, transmit the touch point coordinate to the processor 650, and receive and execute a command sent by the processor 650. In addition, the touch panel 6301 may be implemented by multiple modes such as a resistive mode, a capacitive mode, an infrared mode or a surface acoustic, wave mode. Besides the touch panel 6301, the inputting unit 630 may further include another inputting device 6302. The inputting device 6302 may include, but is not limited to, at least one of a physical keyboard, a function key (such as a volume control key, a switch key etc.), a trackball, a mouse and an operating lever.

The display unit 640 may display information inputted by the user or information provided to the user and various menu interfaces of the mobile terminal 600. The display unit 640 may include a display panel 6401, which may be configured by a Liquid Crystal Display (LCD) and an Organic Light-Emitting Diode (OLED).

It should be noted that the touch panel 6301 may cover the display panel 6401 to form a touch display screen. When a touch operation on or near the touch display screen is detected, and transmitted to the processor 650 to determine a type of a touch event. The processor 650 then provides a corresponding visual output on the touch display screen according to the type of the touch event.

The touch display screen includes an application interface display region and a common controls display region. The application interface display region and the common controls display region may be arranged in an unrestricted manner, such as an upper and lower alignment, a left and right alignment, or other alignments distinguishing the two display regions. The application interface display region may display an interface of the application. Each interface may include at least one application icon and/or interface elements such as a widget desktop control. The application interface display region may also be an empty interface without any content. The common controls display region may display a control with a high usage rate, such as a setting button, an interface number, a scroll bar, a telephone icon and other application icons. The touch screen in the embodiments of the present disclosure is a flexible screen, and both sides of the flexible screen are coated with an organic transparent conductive film of carbon nanotubes.

The processor 650 is a control center of the mobile terminal 600. The processor 650 connects all parts of a mobile phone by various interfaces and lines. The processor 650 performs various functions and processes of the mobile terminal 600 by running or executing software programs and/or modules stored in a first storage 6201 and calling data stored in a second storage 6202, so as to monitor the mobile terminal 600 as a whole. Optionally, the processor 650 may include one or more processing units.

In the mobile terminal of the embodiment, when the static electricity enters the mobile terminal from the side of the touchscreen, the static electricity may be discharged to the touchscreen ground wire, the voltage clamper is in the on-state, and the ground structure is in the on-state and may discharge the static electricity to realize electrostatic protection of the mobile terminal. Furthermore, when no static electricity enters the mobile terminal from the side of the touchscreen, the voltage clamper is in the off-state, and the ground structure is in the off-state, then the present disclosure may effectively avoid a problem in which the touchscreen ground wire and the metal middle frame contact electrolyte simultaneously to generate a galvanic effect which causes a layer separation of the touchscreen ground wire and the touchscreen.

Those ordinary skilled in the art may realize that, the units and the algorithm steps of the examples in the embodiments of the present disclosure may be implemented in a form of electronic hardware, computer software or combination thereof. Whether the units and the algorithm steps are implemented in a form of hardware or software depends on specific applications and design constraints of the technical solutions. Professional technicians may use different methods to implement the described functions for each particular application, and the implementations should not be considered beyond the scope of the present disclosure.

Those skilled in the art may clearly understand that for the sake of convenience and simplicity of description, the specific working processes of the systems, devices and units described above may refer to corresponding processes in the embodiments of the methods described above, and will not be repeated here.

In embodiments of the present disclosure, it should be understood that the disclosed devices and methods may be implemented in other ways. For example, the device embodiments described above are merely illustrative. For example, the division of the units described above is only a logical functional division. In practice, there may be other ways of division, e.g., multiple units or components may be combined or integrated into another system, or some features may be ignored or not implemented. On another hand, a coupling or a direct coupling or a communication connection shown or discussed may be an indirect coupling or a communication connection through some interfaces, devices or units, and may be electrical, mechanical or other forms.

The unit described as a separation component may or may not be physically separated, and the component displayed as a unit may or may not be a physical unit, that is, it may be located in one place or may be distributed over multiple network units. Some or all of the units may be selected according to actual needs to achieve the purpose of the solution of the embodiment of the present disclosure.

In addition, the functional units in various embodiments of the present disclosure may be integrated in one processing unit, may be physically present separately from each other, or may be integrated in one unit by two or more units.

As described above, only specific embodiments of the present disclosure are provided. The protection scope of the present disclosure is not limited to the specific embodiments of the present disclosure described above. Any technician familiar with the technical field who can easily think of changes or substitutions within the technology scope disclosed in the present disclosure shall be covered by the protection scope of the present disclosure. Therefore, the protection scope of the present disclosure shall be subject to the protection scope of the claims.

What is claimed is:

1. A mobile terminal, comprising:
   a touchscreen;
   a liquid crystal module, the touchscreen being arranged on the liquid crystal module; and
   a ground structure, comprising: a touchscreen ground wire, a voltage clamper, and a metal middle frame, wherein a side step of the metal middle frame is made of plastic, a first terminal of the voltage clamper is electrically connected to the touchscreen ground wire, a second terminal of the voltage clamper is electrically connected to the metal middle frame, and the touchscreen ground wire is arranged on a frame of the touchscreen of the mobile terminal, the frame being on a side of the touchscreen of the mobile terminal that is proximate to the liquid crystal module,
   wherein there arranged a gap between the touchscreen ground wire and the liquid crystal module, so as to discharge static electricity entering from a side of the touchscreen,
   wherein the touchscreen is fixedly connected to the touchscreen ground wire of the ground structure.

2. The mobile terminal according to claim 1, wherein the ground structure further comprises: a touchscreen flexible printed circuit board, the voltage clamper is arranged on the touchscreen flexible printed circuit board, wherein the first terminal of the voltage clamper is electrically connected to the touchscreen ground wire, and the second terminal of the voltage clamper is electrically connected to a first terminal of a ground bare area of the touchscreen flexible circuit hoard, a second terminal of the ground hare area is electrically connected to the metal middle frame.

3. The mobile terminal according to claim 2, wherein the second terminal of the ground bare area is electrically connected to the metal middle frame through a conductive foam; and
   wherein the second terminal of the motherboard ground is electrically connected to the metal middle frame through a conductive foam and a screw.

4. The mobile terminal according to claim 1, wherein the ground structure further comprises: a motherboard, the voltage clamper is arranged on the motherboard, wherein the first terminal of the voltage clamper is electrically connected to the touchscreen ground wire, the second terminal of the voltage clamper is electrically connected to a first terminal of a motherboard ground of the motherboard, and a second terminal of the motherboard ground is electrically connected to the metal middle frame.

5. The mobile terminal according to claim 4, wherein the ground structure further comprises: a touchscreen flexible printed circuit board, the touchscreen flexible printed circuit board being electrically connected to the motherboard through a connector, wherein the first terminal of the voltage clamper is electrically connected to the touchscreen ground wire through the touchscreen flexible printed circuit hoard.

6. The mobile terminal according to claim 1, wherein the voltage clamper is a transient voltage suppression diode, a varistor or a polymer electrostatic impeder.

7. The mobile terminal according to claim 1, wherein the voltage clamper is a unidirectional transient voltage suppression diode, a negative electrode of the unidirectional transient voltage suppression diode is electrically connected to the touchscreen ground wire, and a positive electrode of the unidirectional transient voltage suppression diode is electrically connected to the metal middle frame.

8. The mobile terminal according to claim 1, wherein a material conductive ability of the touchscreen ground wire is different from that of the metal middle frame; and
   wherein the touchscreen ground wire is made of silver, the metal middle frame is made of magnesium alloy.

9. The mobile terminal according to claim 1, wherein the touchscreen ground wire comprises a first touchscreen ground wire and a second touchscreen ground wire, the first touchscreen ground wire and the second touchscreen ground wire are arranged on the frame of the touchscreen relatively, and the first terminal of the voltage clamper is electrically connected to the first touchscreen ground wire and the second touchscreen ground wire respectively, the second terminal of the voltage clamper is electrically connected to the metal middle frame.

\* \* \* \* \*